(12) United States Patent
Masuda et al.

(10) Patent No.: US 11,211,891 B2
(45) Date of Patent: Dec. 28, 2021

(54) MOTOR CONTROL DEVICE

(71) Applicant: Panasonic Intellectual Property Management Co., Ltd., Osaka (JP)

(72) Inventors: Takahiro Masuda, Osaka (JP); Taro Kishibe, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 17/054,585

(22) PCT Filed: May 17, 2019

(86) PCT No.: PCT/JP2019/019708
§ 371 (c)(1),
(2) Date: Nov. 11, 2020

(87) PCT Pub. No.: WO2019/239792
PCT Pub. Date: Dec. 19, 2019

(65) Prior Publication Data
US 2021/0184616 A1 Jun. 17, 2021

(30) Foreign Application Priority Data
Jun. 15, 2018 (JP) .............................. JP2018-114960

(51) Int. Cl.
*H02P 1/04* (2006.01)
*H02P 27/08* (2006.01)
(Continued)

(52) U.S. Cl.
CPC ........ *H02P 27/08* (2013.01); *G01R 19/16547* (2013.01); *H02P 6/28* (2016.02); *H02P 23/0004* (2013.01); *H02P 23/14* (2013.01)

(58) Field of Classification Search
CPC .. H02P 27/08; H02P 6/28; H02P 23/14; H02P 23/0004; G01R 19/16547
(Continued)

(56) References Cited

U.S. PATENT DOCUMENTS

2013/0278197 A1* 10/2013 Sasaki ..................... H02P 23/00
318/490
2016/0365819 A1* 12/2016 Masuda .................... H02P 6/08
2018/0354549 A1* 12/2018 Tsubaki ................ H02P 29/024

FOREIGN PATENT DOCUMENTS

JP 62-198278 A 9/1987
JP 7-15972 A 1/1995
(Continued)

OTHER PUBLICATIONS

International Search Report w/English translation and Written Opinion in Japanese dated Jul. 9, 2019, issued in counterpart International Application No. PCT/JP2019/019708 (9 pages).

*Primary Examiner* — Erick D Glass
(74) *Attorney, Agent, or Firm* — Westerman, Hattori, Daniels & Adrian, LLP (57) ABSTRACT

A motor control device that detects a motor current through ΔΣ AD conversion includes a stop signal generator and a stop signal controller. When a difference between a maximum value and a minimum value of three phase voltage command values to be applied to a motor is smaller than or equal to a predetermined threshold, a stop signal that causes the ΔΣ AD conversion to stop is output with a delay by the time corresponding to a delay in current detection while a leakage current caused by on and off of a power conversion element is occurring.

6 Claims, 6 Drawing Sheets

(51) Int. Cl.
*H02P 6/28* (2016.01)
*G01R 19/165* (2006.01)
*H02P 23/00* (2016.01)
*H02P 23/14* (2006.01)

(58) Field of Classification Search
USPC .................................................. 318/400.17
See application file for complete search history.

(56) References Cited

FOREIGN PATENT DOCUMENTS

| | | |
|---|---|---|
| JP | 2011-22692 A | 2/2011 |
| WO | 2016/051743 A1 | 4/2016 |

\* cited by examiner

MOTOR CONTROL DEVICE

TECHNICAL FIELD

The present invention relates to a motor control device that controls a motor through pulse width modulation (PWM) control of a voltage to be applied to a winding in the motor.

BACKGROUND ART

In a servomotor used in factory automation (FA), the position, the speed, and the torque of the motor are controlled so as to follow a drive command (position command) from a higher device. Widely used in such control is digital control in which a microprocessor serves as a computation device for the control. Torque output by a surface permanent magnet synchronous motor used in a servomotor is in a proportional relationship to the motor current. Therefore, the torque output from the motor can be controlled freely by controlling the motor current. A PWM control scheme typically used to control a motor current requires detection of a current that flows in a winding in a motor (hereinafter, the motor current). In the case of digital control, the motor current is detected in every predetermined cycle, and this motor current is controlled through proportional integral differential (PID) control or the like so as to make the motor current match a current command value.

Figure 6:
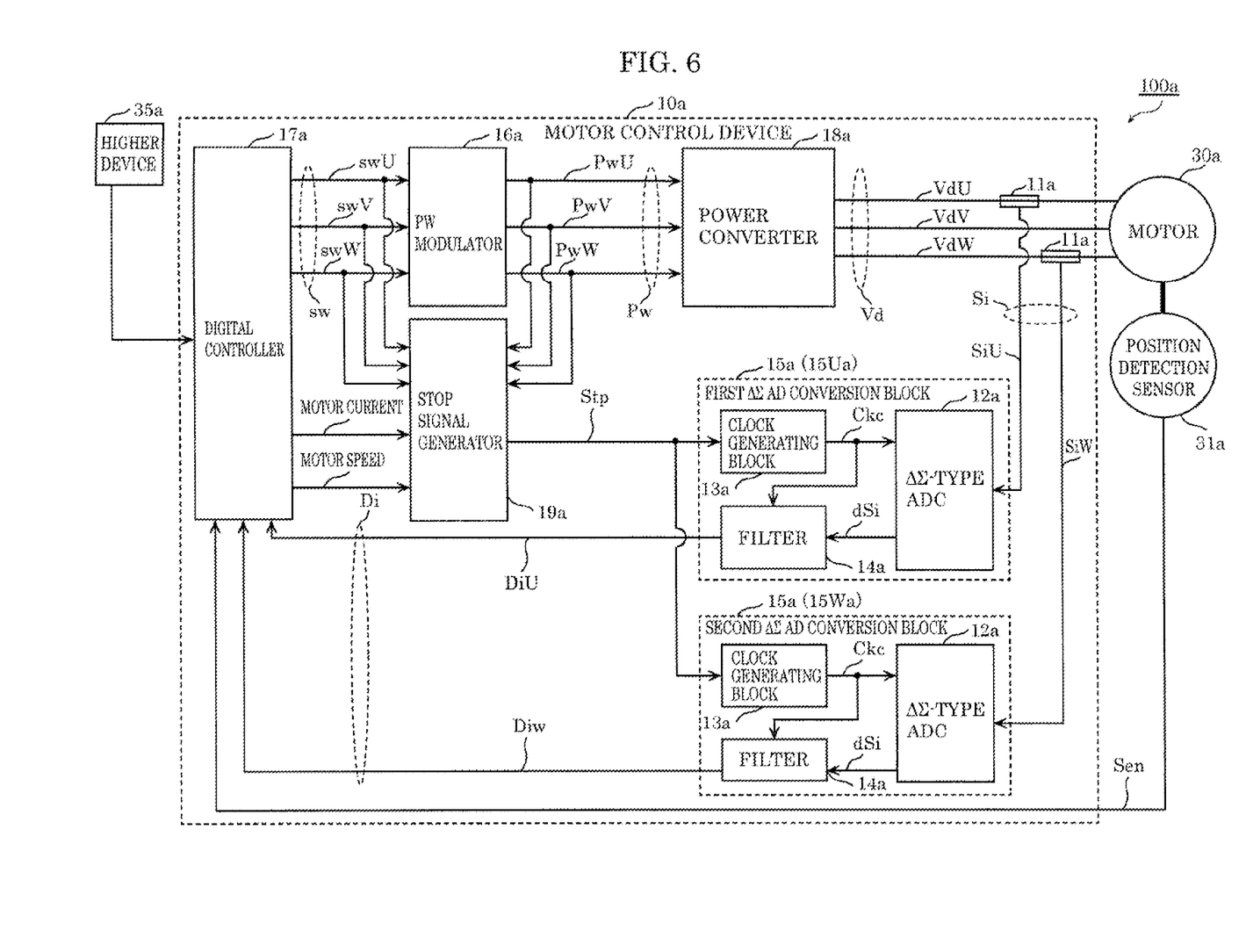
FIG. 6 is a configuration diagram of a motor control device according to a conventional example.

FIG. 6 is a configuration diagram of motor control device 10a of a conventional example illustrated in PTL 1. This motor control device 10a includes motor current detectors 11a provided for motor 30a that includes a stator having windings of three phases wound thereon. Motor current detectors 11a each detect the current that flows in the corresponding winding. Thus, motor control device 10a controls the operation of motor 30a. Furthermore, motor control device 10a includes digital controller 17a, pulse width (PW) modulator 16a, power converter 18a, motor current detector 11a, ΔΣ analog-to-digital (AD) converter 15a, and stop signal generator 19a. Digital controller 17a performs a torque computation based on an operation command from higher device 35a, position information of the motor obtained from position detection sensor 31a, and a motor current detection value indicating the value of a current that flows in a winding. Digital controller 17a further calculates a voltage command value for driving motor 30a. PW modulator 16a modulates a pulse width by comparing the voltage command value against a triangular wave and outputs a PWM switching signal. Power converter 18a applies a drive voltage to a winding by switching a switching element (power conversion element) on or off in accordance with the PWM switching signal. Motor current detector 11a converts a current that flows in a winding in response to the drive voltage to an analog voltage. ΔΣ AD conversion block 15a converts the analog voltage to a digital signal. Stop signal generator 19a outputs a stop signal that causes ΔΣ AD conversion block 15a to stop operating. In order to reduce false detection of a leakage current caused by the on and off (hereinafter, switching) of the power conversion element (e.g., a high-speed power switching element) for the voltage to be applied to motor 30a, if a difference between a maximum value and a minimum value of three phase voltage command values in the PWM control is smaller than or equal to a predetermined threshold, stop signal generator 19a outputs a stop signal while a leakage current caused by the on and off of the power conversion element is occurring.

CITATION LIST

Patent Literature

PTL 1: International Patent Publication No. 2016/051743

SUMMARY OF THE INVENTION

Technical Problem

However, in a motor control device in which the value of a current that is to flow in a winding in a motor is as relatively high as several hundred amperes, the circuit structure of the motor current detector is complex, and thus a time delay occurs when the current that flows in the winding is converted to an analog voltage. Accordingly, the operation of a ΔΣ AD conversion block is stopped while a leakage current is occurring in a conventional configuration. Thus, a timing mismatch occurs in the analog voltage value, which leads to shortcomings in that false detection of a leakage current included in a digital signal converted by the ΔΣ AD conversion block cannot be reduced.

The present disclosure has been made in view of such shortcomings and is directed to providing a motor control device that can reduce false detection of a leakage current caused by the on and off of a power conversion element even in a case where a delay occurs when a current that flows in a winding is converted to an analog voltage.

Solutions to Problem

A motor control device according to one aspect of the present disclosure is a motor control device that includes a motor current detector and controls an operation of a motor. The motor includes a stator having windings of three phases wound thereon, and the motor current detector detects a current that flows in the windings. The motor control device includes: a digital controller that performs a torque computation based on an operation command from a higher device, position information of the motor, and a motor current detection value indicating a value of a current that flows in the windings, and calculates three phase voltage command values for driving the motor; a pulse width (PW) modulator that performs pulse width modulation (PWM) by comparing the three phase voltage command values against a triangular wave and outputs three phase PWM switching signals; a power converter that applies a given voltage within a predetermined range to the windings by switching a power conversion element on or off in accordance with the three phase PWM switching signals; the motor current detector that converts a current that flows in the windings in response to the given voltage to an analog voltage; a ΔΣ analog-to-digital (AD) conversion block that converts the analog voltage to a digital signal; a stop signal generator that outputs a stop signal for stopping of an operation of the ΔΣ AD conversion block; and a stop signal controller that, based on the stop signal, outputs a stop control signal that causes the ΔΣ AD conversion block to stop operating, wherein when a difference between a maximum value and a minimum value of the three phase voltage command values is smaller than or equal to a predetermined threshold, the stop signal generator outputs the stop signal while a leakage current caused by on and off of the power conversion element is occurring, and the stop signal controller outputs the stop control signal obtained by delaying the stop signal by an amount of time it takes the motor current detector and the ΔΣ AD conversion block to convert the leakage current to the digital signal.

Advantageous Effect of Invention

The motor control device according to one aspect of the present disclosure can reduce false detection of a leakage current caused by the on and off of the power conversion element even in a case where a delay occurs when a current that flows in a winding is converted to an analog voltage.

DESCRIPTION OF EXEMPLARY EMBODIMENT

A motor control device according to one aspect of the present disclosure is a motor control device that includes a motor current detector and controls an operation of a motor. The motor includes a stator having windings of three phases wound thereon, and the motor current detector detects a current that flows in the windings. The motor control device includes a digital controller, a pulse width (PW) modulator, a power converter, the motor current detector, a ΔΣ analog-to-digital (AD) conversion block, a stop signal generator, and a stop signal controller. The digital controller performs a torque computation based on an operation command from a higher device, position information of the motor, and a motor current detection value indicating a value of a current that flows in the windings, and calculates three phase voltage command values for driving the motor. The PW modulator performs pulse width modulation (PWM) by comparing the three phase voltage command values against a triangular wave and outputs three phase PWM switching signals. The power converter applies a given voltage within a predetermined range to the windings by switching a power conversion element on or off in accordance with the three phase PWM switching signals. The motor current detector converts a current that flows in the windings in response to the given voltage to an analog voltage. The ΔΣ AD conversion block converts the analog voltage to a digital signal. The stop signal generator outputs a stop signal for stopping of an operation of the ΔΣ AD conversion block. The stop signal controller, based on the stop signal, outputs a stop control signal that causes the ΔΣ AD conversion block to stop operating. In a case where a difference between a maximum value and a minimum value of the three phase voltage command values is smaller than or equal to a predetermined threshold, the stop signal generator outputs the stop signal while a leakage current caused by on and off of the power conversion element is occurring, and the stop signal controller outputs the stop control signal obtained by delaying the stop signal by an amount of time it takes the motor current detector and the ΔΣ AD conversion block to convert the leakage current to the digital signal.

The above motor control device can reduce false detection of a leakage current caused by the on and off of the power conversion element even in a case where a delay occurs when a current that flows in a winding is converted to an analog voltage.

The position information may be information on the position of a rotor in the motor detected by a position detection sensor.

With this configuration, the motor control device can use the information on the position of the rotor detected by the position sensor as the position information.

The stop signal generator may include a timer. The stop signal generator may start outputting the stop signal and start a timing operation when any one of the three phase PWM switching signals has changed first within a region between an upper vertex and a lower vertex of the triangular wave. The stop signal generator may output the stop signal until a timer counter reaches a predetermined value.

With this configuration, the motor control device can determine the timing to start outputting the stop signal based on the three phase PWM switching signals. This makes it possible to control the stop signal with a relatively simple configuration.

The ΔΣ AD conversion block may include a ΔΣ-type AD converter that converts the analog voltage to a 1-bit digital signal, an AD conversion thinning filter that converts the 1-bit digital signal to a multi-bit digital signal and outputs the multi-bit digital signal as the motor current detection value, and a clock generating block that outputs an operation clock that causes the ΔΣ-type AD converter and the AD conversion thinning filter to operate. The operation clock may be stopped by the stop control signal.

With this configuration, the motor control device can cause the ΔΣ AD conversion block to stop operating with the use of the stop control signal.

The stop signal generator may refrain from outputting the stop signal in a case where the motor current detection value is greater than or equal to a predetermined value.

With this configuration, the motor control device can reduce false detection at the time of a servo lock or a low-torque operation in which an influence of a leakage current caused by the on and off of the power conversion element increases with respect to the magnitude of the motor current detection value.

The stop signal generator may refrain from outputting the stop signal in a case where a motor speed is greater than or equal to a predetermined value.

With this configuration, the motor control device can reduce false detection at the time of a low-speed operation in which the speed fluctuation increases due to an influence of unnecessary torque caused by a leakage current.

Hereinafter, a specific example of the motor control device according to one aspect of the present disclosure will be described with reference to the drawings.

It is to be noted that the embodiment described hereinafter merely illustrates a specific, preferable example of the present disclosure. The numerical values, the shapes, the materials, the constituent elements, the arrangement positions and the connection modes of the constituent elements, the steps, the orders of the steps, and so on illustrated in the following embodiment are examples and are not intended to limit the present invention. The present invention can be limited solely by the claims. Therefore, among the constituent elements in the following embodiment, any constituent element that is not described in the independent claim expressing the broadest concept of the present invention is not necessarily required in order to overcome the shortcomings faced by the present invention and is construed as an element forming a more preferable embodiment.

EMBODIMENT

Figure 1:
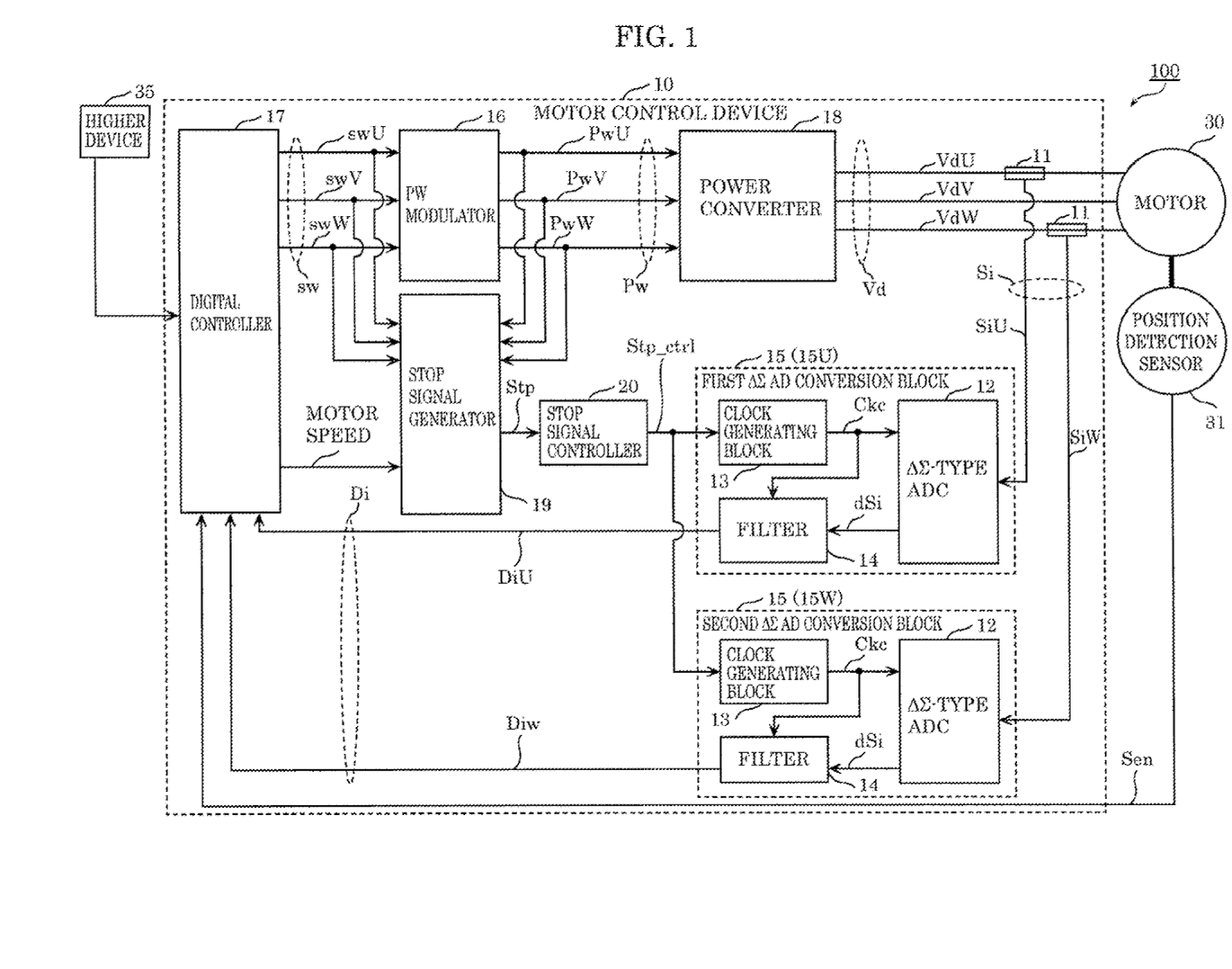
FIG. 1 is a configuration diagram of a motor control system that includes a motor control device according to an embodiment.
Figure 2:
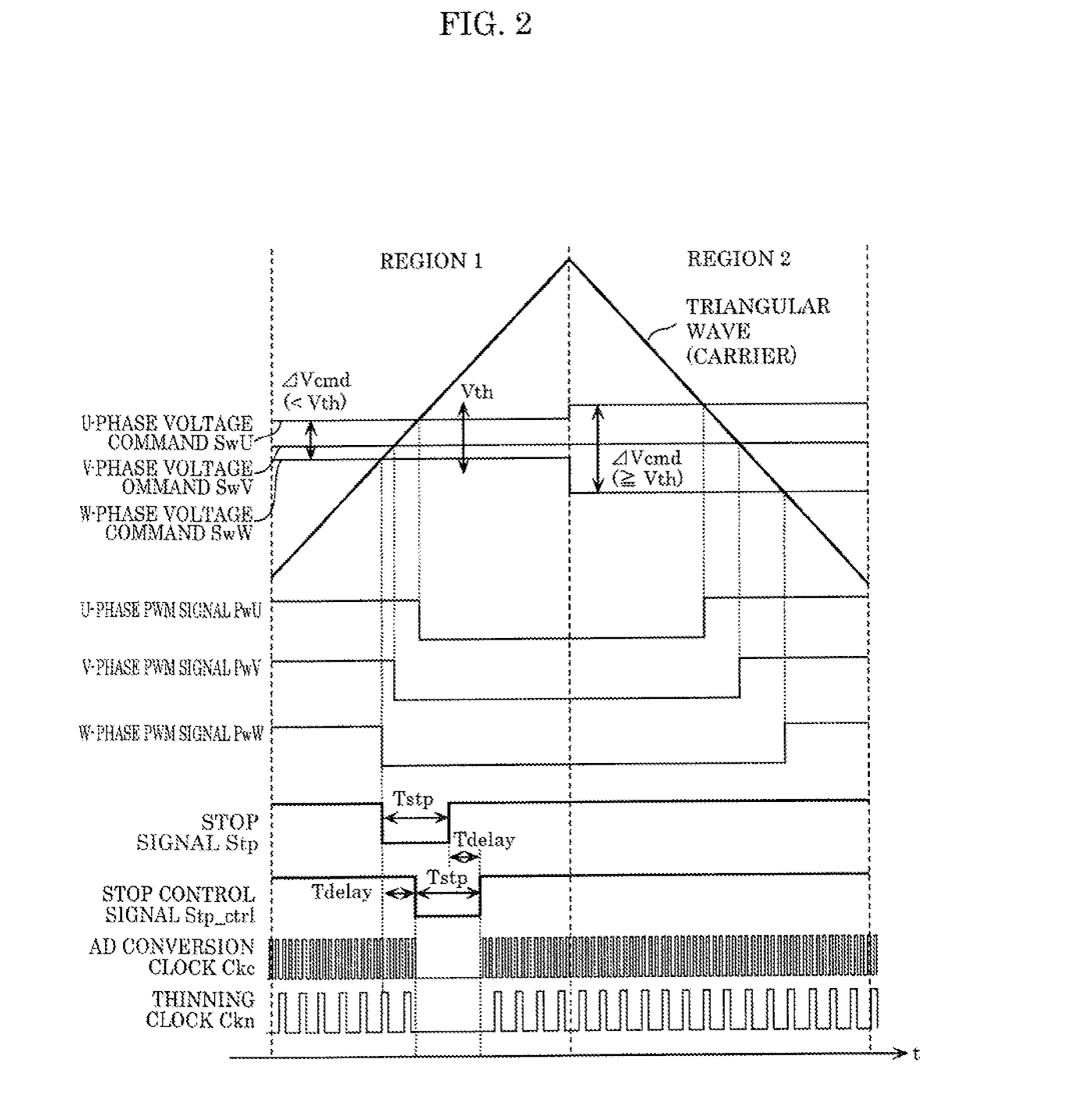
FIG. 2 is an operation waveform diagram for describing an operation of a ΔΣ AD conversion block to be used to detect a motor current in the motor control device.
Figure 3:
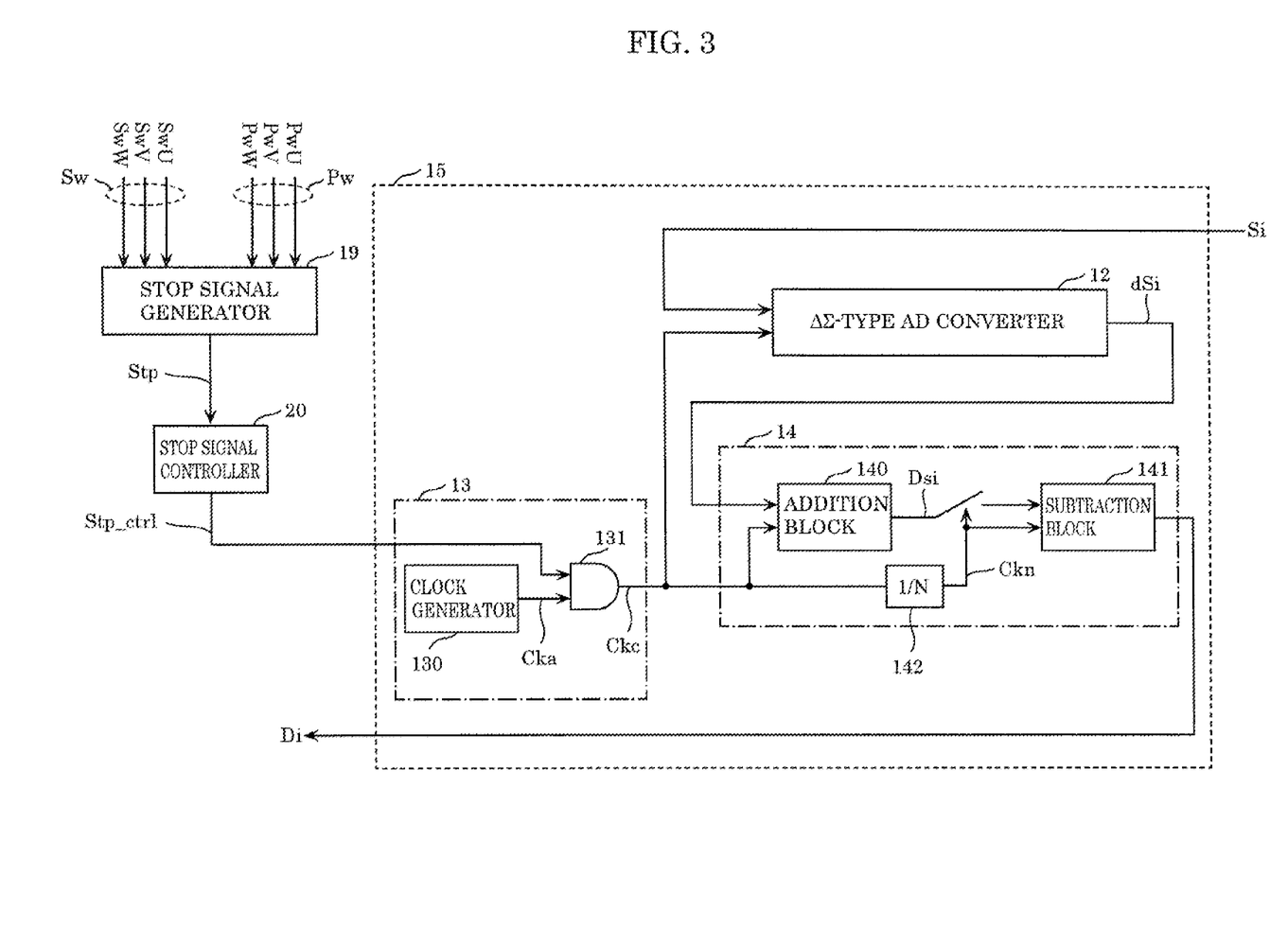
FIG. 3 is a configuration diagram of the ΔΣ AD conversion block in the motor control device.

FIG. 1 is a configuration diagram of a motor control system that includes a motor control device according to the present embodiment. FIG. 2 is an operation waveform diagram for describing an operation of a ΔΣ AD conversion block to be used to detect a motor current. FIG. 3 is a configuration diagram of the ΔΣ AD conversion block that detects a motor current.

As illustrated in FIG. 1, in motor control system 100, motor control device 10 controls an operation of motor 30 in accordance with command control of higher device 35.

Higher device 35 is constituted by, for example but not limited to, a programmable logic controller. Higher device 35 controls motor control device 10 through an operation command or the like. Higher device 35 and motor control device 10 are communicably connected to each other via a control bus line or the like. An operation command from higher device 35 is transmitted to motor control device 10, and information from motor control device 10 is transmitted to higher device 35.

Motor 30 illustrated in FIG. 1 is preferably a three-phase brushless motor, which is widely used because of its efficiency and controllability. Motor 30, which is a three-phase brushless motor, includes a stator and a rotor. The stator includes a stator core having a U-phase winding, a V-phase winding, and a W-phase winding wound thereon. The rotor includes a permanent magnet. Drive voltage Vd generated in motor control device 10 is applied to the U-phase winding as drive voltage VdU, applied to the V-phase winding as drive voltage VdV, and applied to the W-phase winding as drive voltage VdW. This causes the rotor to rotate. In order to detect the position of the rotor, position detection sensor 31, such as a rotary encoder, a linear scale, or a Hall current transformer (CT), is disposed in the vicinity of the rotor. Position detection sensor 31 outputs information on the detected position of the rotor to motor control device 10 as position information Sen. Instead of using a device such as a rotary encoder, the position of the motor may be estimated from a current detection value.

Motor control device 10 includes digital controller 17 that controls a rotary operation of motor 30, PW modulator 16 that generates a PWM signal, and power converter 18 that feeds power to and drive the windings in motor 30. In order to detect and process a motor current, motor control device 10 further includes motor current detector 11, AD conversion block 15, stop signal generator 19, and stop signal controller 20. Thus, motor control device 10 controls the operation of motor 30.

Digital controller 17 is constituted by software of a digital signal processor (DSP) or a microcomputer or by a logic circuit of an application specific integrated circuit (ASIC) or a field programmable gate array (FPGA). In other words, digital controller (simply referred to below as controller, as appropriate) 17 is configured to execute each process in accordance with software, such as a program, that indicates the processing procedures. In addition, controller 17 mainly processes, as a signal to be processed, a digital signal composed of a data array in which pieces of data of a predetermined number of bits are arrayed.

Digital controller 17 receives, from higher device 35, information and so on of an operation command directing the position, the speed, the torque, and so on. In addition, digital controller 17 transmits information and so on of motor control device 10 to higher device 35. In addition to performing the communication function of transmitting such information, digital controller 17 controls the rotary operation of motor 30. Digital controller 17 controls the operation of motor 30 to set motor 30 in a predetermined motion in terms of, for example but not limited to, its speed and its position.

In one example of a more specific process of digital controller 17, digital controller 17 executes the following control process based on feedback control.

Digital controller 17 generates a speed command by performing a position controlling computation based on an operation command instructing the position received from higher device 35 and position information Sen detected by position detection sensor 31. Next, digital controller 17 calculates, through differentiation of position information Sen, a motor speed value corresponding to an actual speed of motor 30 and calculates a current command through a speed controlling computation based on the motor speed and the speed command. Next, digital controller 17 calculates a voltage command for each phase through a current controlling computation based on the calculated current command and U-phase motor current detection value DiU and W-phase motor current detection value DiW obtained via motor current detector 11 and AD conversion block 15. Then, digital controller 17 outputs U-phase voltage command value SwU, V-phase voltage command value SwV, and W-phase voltage command value SwW as voltage command values Sw indicating the U-phase, V-phase, and W-phase voltage commands for driving the motor. In other words, digital controller 17 performs a torque computation based on the operation command from higher device 35, the position information of motor 30, and the motor current detection value indicating the value of the current that flows in each winding. Thus, digital controller 17 calculates three phase voltage command values for driving motor 30.

PW modulator 16 is constituted by a peripheral with a built-in microcomputer or by a logic circuit of an ASIC or an FPGA. PW modulator 16 generates PWM switching signal (simply referred to below as PWM signal, as appropriate) Pw for each phase by comparing voltage command value Sw of each phase against a carrier signal of a triangular wave formed, for example, by an up-down counter, as illustrated in FIG. 2.

In an upper section of FIG. 2, the carrier signal of a triangular wave, voltage command values Sw, and PWM signals Pw are illustrated. As illustrated in FIG. 2, in region 1 corresponding to a period in which the level of the triangular wave continuously increases, PWM signal Pw falls from a high level to a low level when the level of the triangular wave reaches or exceeds the level of corresponding voltage command value Sw. Then, in region 2 corresponding to a period in which the level of the triangular wave continuously decreases, PWM signal Pw rises from a low level to a high level when the level of the triangular wave reaches or falls below the level of the corresponding voltage command. By repeating such an operation, PW modulator 16 generates, for each phase, PWM signal Pw composed of a pulse train having a pulse width or a duty cycle corresponding to the level of corresponding voltage command value Sw. PWM signal Pw generated in this manner is supplied to power converter 18. In other words, PW modulator 16 modulates the pulse width by comparing the three phase voltage command values against the triangular wave and outputs three phase PWM switching signals.

Power converter 18 generates drive voltage Vd in response to receiving PWM signal Pw for each phase from PW modulator 16. Power converter 18 applies U-phase drive voltage VdU, V-phase drive voltage VdV, and W-phase drive voltage VdW to the respective windings in motor 30 via motor lines. Power converter 18 is a so-called inverter and is constituted by a high-speed power switching element, such as an insulated gate bipolar transistor (IGBT) or a power metal oxide semiconductor field effect transistor (MOSFET), and a power conversion element, such as a diode. Power converter 18 generates drive voltages Vd by using a switching element (power conversion element), such as an IGBT to switch the voltage supplied from a power source, that is, to switch on or off the voltage supplied from the power source in accordance with PWM signals Pw. In other words, power converter 18 applies a given voltage within a predetermined range to each winding by switching the power conversion element on or off in accordance with the three phase PWM switching signals. Recently, through an intelligent power module (IPM) with a built-in pre-drive circuit for driving a power conversion element, an integrated power converter is often used.

Motor current detector 11 detects the amount of a motor current that flows in a winding when drive voltage Vd is applied to that winding and outputs the detection result as current detection signal Si. Specifically, motor current detector 11 converts each of the motor current that flows in a U-phase motor line and the motor current that flows in a W-phase motor line to a voltage and outputs U-phase current detection signal SiU and W-phase current detection signal SiW. Motor current detector 11 adopts a shunt resistance in a case where the motor current is small. In a case where the motor current is large in particular, the current is transformed to a current of a value of one several thousandth through a current transfer (CT), and the current output from the CT is detected with a shunt resistance. In other words, motor current detector 11 detects the current that flows in a given winding and converts the current that flows in the winding in response to a given voltage within a predetermined range to an analog voltage. Current detection signal Si output by motor current detector 11 is supplied to $\Delta\Sigma$ AD conversion block 15.

As illustrated in FIG. 1, $\Delta\Sigma$ AD conversion block (may also be referred to below simply as AD conversion block, as appropriate) 15 includes first AD conversion block 15U and second AD conversion block 15W. U-phase current detection signal SiU is supplied to first AD conversion block 15U, and W-phase current detection signal SiW is supplied to second AD conversion block 15W. Each AD conversion block 15 includes $\Delta\Sigma$-type AD converter 12, AD conversion thinning filter 14, and clock generating block 13. Each AD conversion block 15 converts a supplied analog signal (analog voltage) to a digital signal and outputs the converted digital signal. In particular, in the present embodiment, $\Delta\Sigma$-type AD converter (may also be referred to below simply as AD converter, as appropriate) 12 that is a $\Delta\Sigma$-type analog-to-digital converter as described above is used.

FIG. 3 is a configuration diagram of such AD conversion block 15. Details of stop signal generator 19 and stop signal controller 20 illustrated in FIG. 3 will be described later.

In AD conversion block 15 illustrated in FIG. 3, clock generating block 13 includes clock generator 130 and logical product gate 131. Clock generator 130 generates source clock Cka that determines the conversion cycle of AD converter 12. In addition, logical product gate 131 obtains a logical product of source clock Cka and stop control signal Stp_ctrl described later and outputs the result as AD conversion clock Ckc. The frequency of source clock Cka may be determined based on the AD conversion resolution required in the current control by digital controller 17 and the permitted amount of a conversion delay associated with thinning through a filter. Normally, a frequency of several tens of MHz is used. In other words, clock generating block 13 outputs AD conversion clock Ckc that is an operation clock for causing $\Delta\Sigma$-type AD converter 12 and AD conversion thinning filter 14 to operate. Then, $\Delta\Sigma$ AD conversion block 15 stops AD conversion clock Ckc, which is an operation clock, based on stop control signal Stp_ctrl.

AD converter 12 includes a comparator that performs a comparison against a threshold, for example. AD converter 12 compares supplied current detection signal Si against the threshold in terms of its magnitude. Next, AD converter 12 binarizes the comparison result to convert current detection signal Si to a 1-bit digital signal. Then, AD converter 12 outputs the converted 1-bit digital signal as AD conversion signal dSi in every cycle of AD conversion clock Ckc. In other words, AD conversion signal dSi output from AD converter 12 is a signal composed of pulses, and the high level and the low level of that signal correspond to the values of 1 and 0 of each 1-bit digital signal. In this manner, $\Delta\Sigma$-type AD converter 12 converts an input analog voltage to a 1-bit digital signal.

AD conversion thinning filter 14 (may also be referred to below as a thinning filter, as appropriate) constitutes a digital filter called a sinc filter in which the frequency characteristic follows a sinc function. AD conversion thinning filter 14 includes addition block 140 that includes an adder and subtraction block 141 that includes a subtractor. Addition block 140 integrates, with the adder, AD conversion signal dSi, which is a 1-bit digital signal, output from AD converter 12 in every cycle of AD conversion clock Ckc and thus generates multi-bit added data Dsi. The number of bits in this added data Dsi corresponds to the AD conversion resolution of AD conversion block 15. Next, AD conversion clock frequency divider 142 frequency-divides an AD conversion clock to 1/N (N is an nth power of 2, and n is an integer) to generate thinning clock Ckn. In other words, AD conversion clock frequency divider 142 frequency-divides AD conversion clock Ckc of a high clock rate so-called an oversampling clock into thinning clock Ckn of a desired low clock rate. Subtraction block 141 operates in accordance with the cycle of this thinning clock Ckn. Subtraction block 141 computes the difference between the previous value of added data Dsi and the present value of added data Dsi to obtain the frequency characteristic that follows a sinc function. Thinning filter 14 constituted by such addition block 140 and subtraction block 141 can implement a filter having a low-pass characteristic. Thus, thinning filter 14 cuts high-frequency noise and generates filtered motor current detection value Di converted to have the number of bits for the desired resolution. In other words, AD conversion thinning filter 14 converts 1-bit digital signals to a multi-bit digital signal and outputs the multi-bit digital signal as a motor current detection value.

Motor current detection value DiU generated by first AD conversion block 15U and motor current detection value DiW generated by second AD conversion block 15W in the manner described above are supplied to digital controller 17. Digital controller 17 performs a current controlling computation based on supplied motor current detection values DiU and DiW and calculates voltage command value Sw for generating each drive voltage Vd.

As described above, motor control device 10 generates drive voltage Vd in which a drive waveform for driving a winding is reproduced with pulse width modulated pulses by switching a switching element connected to a power source. Therefore, a leakage current may occur at the moment of switching, and this leakage current may influence AD conversion block 15 in the form of noise or the like. As a result, the accuracy of motor current detection values DiU and DiW may decrease. In addition, in a case where motor current detector 11 is constituted by a combination of a CT and a shunt resistance in order to detect a large current, a delay of several microseconds to ten or so microseconds arises at the time of transforming the current with the CT, and the occurrence timing of a leakage current included in current detection signal Si is delayed relative to the moment of switching. Therefore, in order to suppress the influence of a leakage current, as illustrated in FIG. 1, stop signal generator 19 and stop signal controller 20 are further provided, and the influence of a leakage current is suppressed by causing AD conversion block 15 to stop operating for a predetermined period with the use of stop control signal Stp_ctrl described later.

As illustrated in FIGS. 1 and 3, stop signal generator 19 is supplied with voltage command value Sw of each phase and PWM signal Pw of each phase. Then, based on voltage command value Sw of each phase, stop signal generator 19 first determines whether each voltage command value Sw indicates a stop-enabled mode. Furthermore, stop signal generator 19 generates stop signal Stp of a predetermined timing and with a predetermined pulse width based on an edge at which the level of supplied PWM signal Pw changes. In addition, as illustrated in FIGS. 1 and 3, stop signal Stp is supplied to stop signal controller 20. Then, stop signal controller 20 corrects the delay time arising until a leakage current that occurs at the moment of switching described above is converted to current detection signal Si and generates stop control signal Stp_ctrl. In the case of the stop-enabled mode, this stop control signal Stp_ctrl is supplied to each AD conversion block 15 and further supplied to the input of one of logical product gates 131 of clock generating blocks 13. With this configuration, clock generating block 13 refrains from outputting source clock Cka with the use of logical product gate 131 when stop control signal Stp_ctrl indicates a clock stop. In contrast, clock generating block 13 outputs source clock Cka as AD conversion clock Ckc when stop control signal Stp_ctrl does not indicate a clock stop. In other words, stop signal generator 19 outputs stop signal Stp for stopping the operation of ΔΣ AD conversion block 15, and stop signal controller 20 outputs, based on the stop signal, stop control signal Stp_ctrl that causes ΔΣ AD conversion block 15 to stop operating.

Figure 4:
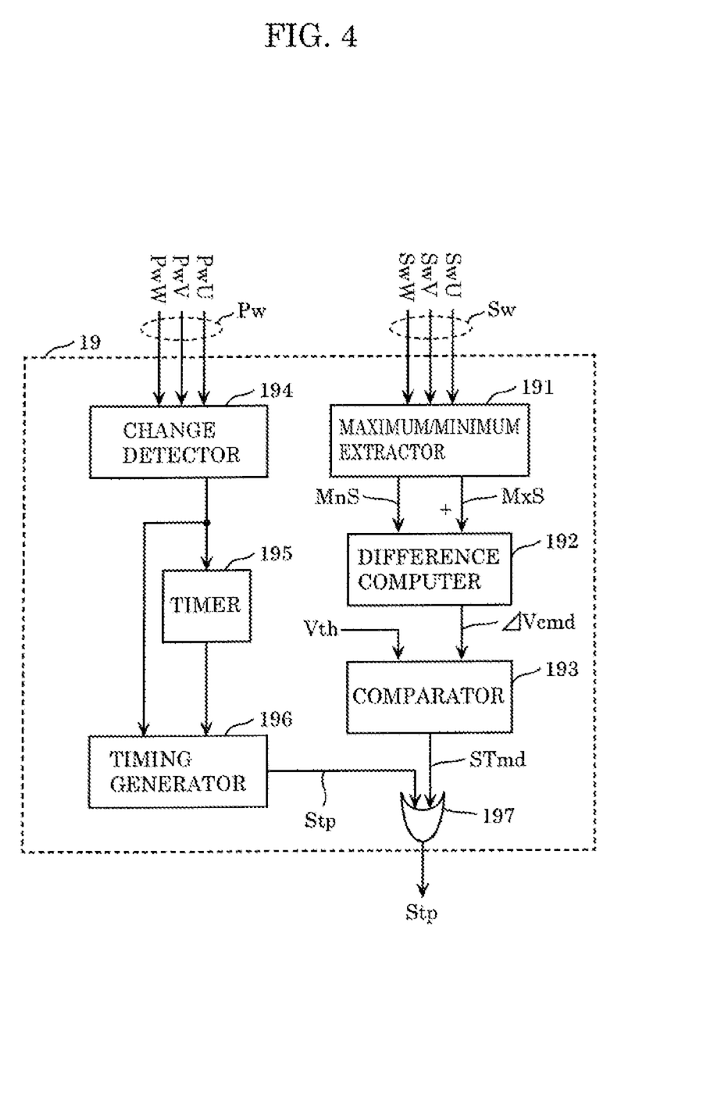
FIG. 4 is a configuration diagram of a stop signal generator in the motor control device.

FIG. 4 is a configuration diagram illustrating an example of stop signal generator 19.

In an example illustrated in FIGS. 1 to 4, specifically, stop control signal Stp_ctrl is at a low level, and this indicates a clock stop. First, as illustrated in FIGS. 1, 3, and 4, stop signal generator 19 is supplied with U-phase voltage command value SwU, V-phase voltage command value SwV, W-phase voltage command value SwW, U-phase PWM signal PwU, V-phase PWM signal PwV, and W-phase PWM signal PwW. Then, in the present embodiment, as illustrated in FIG. 2, a region between and an upper vertex and a lower vertex of a triangular wave in the level direction serves as one unit region, and the following operation is performed in this unit region.

First, stop signal generator 19 extracts a maximum value and a minimum value from U-phase voltage command value SwU, V-phase voltage command value SwV, and W-phase voltage command value SwW. Next, stop signal generator 19 calculates difference ΔVcmd between the extracted maximum value and minimum value. Then, stop signal generator 19 compares difference ΔVcmd against predetermined threshold Vth. Based on this comparison result, stop signal generator 19 adopts the stop-enabled mode in which an output of a stop signal in accordance with an output determination of the stop signal is enabled in a region in which difference ΔVcmd is smaller than threshold Vth (e.g., the case of region 1 illustrated in FIG. 2). Meanwhile, stop signal generator 19 adopts a stop-disabled mode in which the output determination is not made in a case where difference ΔVcmd is greater than or equal to threshold Vth and refrains from outputting the stop signal (e.g., the case of region 2 illustrated in FIG. 2).

In the configuration example of stop signal generator 19 illustrated in FIG. 4, first, maximum and minimum values extractor 191 extracts maximum value MxS and minimum value MnS from U-phase voltage command value SwU, V-phase voltage command value SwV, and W-phase voltage command value SwW. Next, difference computer 192 calculates difference ΔVcmd between extracted maximum value MxS and minimum value MnS. Next, comparator 193 compares difference ΔVcmd against threshold Vth and outputs the result of this comparison in the form of stop mode signal STmd. In FIG. 4, logical sum gate 197 is provided as an output switch for stop signal Stp. In addition, FIG. 4 illustrates a case in which the stop-enabled mode is adopted when stop mode signal STmd is at a low level and the stop-disabled mode is adopted when stop mode signal STmd is at a high level. In other words, stop signal Stp that indicates the clock stop when it is at a low level is output from stop signal generator 19 via logical sum gate 197 when the stop-enabled mode is adopted. In contrast, when the stop-disabled mode is adopted, the output of stop signal generator 19 is constantly at a high level, and no stop signal Stp is output.

Herein, in the case of a typical three-phase brushless motor, U-phase, V-phase, and W-phase voltage command values Sw are sinusoidal voltage commands and are offset from each other by an electrical angle of 120 degrees. In this case, with regard to difference ΔVcmd between a maximum value and a minimum value of three phase voltage command values Sw, voltage command values Sw of two phases out of the three phases provide the voltage command value of either the maximum value or the minimum value at most of the timings. In other words, at a timing at which waveforms of two phases overlap, two phases out of the three phases have the same voltage command value, and these two phases have the voltage command value of either the maximum value or the minimum value. Difference ΔVcmd in this case is a value obtained by calculating the difference between the two phases.

Through the stop mode determination operation described above, stop signal generator 19 detects a case where the timing at which each PWM signal Pw changes, that is, the timing at which each PWM signal Pw rises or falls matches or is similar between the phases and adopts the stop-enabled mode in such a case. In other words, in a case where the timing at which PWM signal Pw changes matches or is similar as in the case of a servo lock, for example, a leakage current reinforces each other to increase the influence. In this respect, in the present embodiment, a case where the influence of a leakage current is large is detected through an operation that utilizes the levels of voltage command values Sw.

Next, stop signal generator 19 uses U-phase PWM signal PwU, V-phase PWM signal PwV, and W-phase PWM signal PwW in order to determine the output timing of stop signal Stp. First, stop signal generator 19 sets stop signal Stp to a low level when any one of PWM signals Pw has changed first within a given region. Next, in order to determine the timing to bring stop signal Stp back to a high level, stop signal generator 19 performs a timing operation with the use of a timer for the duration in which stop signal Stp is at a low level. Then, stop signal generator 19 sets the stop signal to a high level after time Tstp has passed.

In the configuration example of stop signal generator 19 illustrated in FIG. 4, when any one PWM signal Pw of input PWM signal PwU, PWM signal PwV, and PWM signal PwW has changed first within a given region, change detector 194 notifies timing generator 196 and timer 195 of the timing of that change. Thus, timing generator 196 sets stop signal Stp to a low level and outputs stop signal Stp. In addition, timer 195 starts a timing operation and counts until the timer count reaches a predetermined value. Then, timer 195 transmits a set signal to timing generator 196 when time Tstp, which is a predetermined time, has passed. Based on the timing of this notification, timing generator 196 sets stop signal Stp to a high level and outputs stop signal Stp. Though the process described above, stop signal Stp is output to logical sum gate 197.

Herein, with regard to threshold Vth and time Tstp, motor current detection value Di held at the time of a servo lock may be measured, and threshold Vth and time Tstp may be set to values that can minimize the influence of a leakage current. For example, threshold Vth may be set to a value that is approximately 10% of a maximum value of voltage command value Sw. Time Tstp may be set to a value greater than the time obtained by adding the duration (typically, several microseconds) of a leakage current caused by switching to the time in which the triangular wave changes by threshold Vth.

In this manner, stop signal generator 19 outputs a stop signal while a leakage current caused by the on and off of the power conversion element is occurring in a case where the difference between the maximum value and the minimum value of the three phase voltage command values is smaller than or equal to a predetermined threshold. In addition, as described above, stop signal generator 19 includes the timer and starts outputting a stop signal and starts a timing operating when any one of the three phase PWM switching signals has changed first within a region between an upper vertex and a lower vertex of the triangular wave. Stop signal generator 19 outputs the stop signal until the timer counter reaches a predetermined value.

Figure 5:
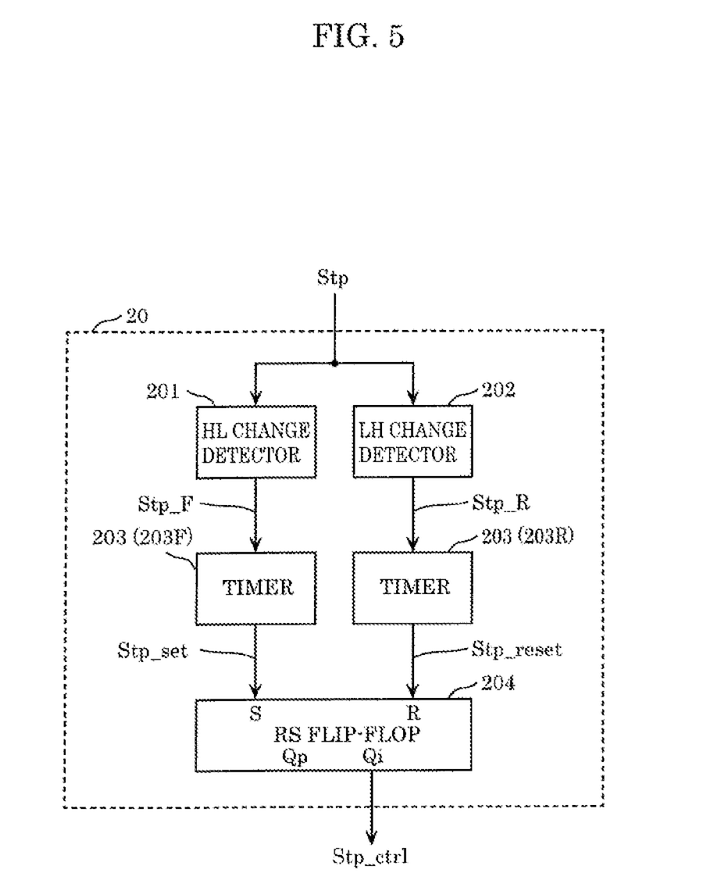
FIG. 5 is a configuration diagram of a stop signal controller in the motor control device.

FIG. 5 is a configuration diagram illustrating an example of stop signal controller 20.

Stop signal controller 20 is supplied with stop signal Stp. First, HL change detector 201 detects a change (falling edge) of Stp from a high level to a low level and generates Stp fall detection pulse Stp_F. In addition, LH change detector 202 detects a change (rising edge) of Stp from a low level to a high level and generates Stp rise detection pulse Stp_R. Next, timer 203F and timer 203R start a timing operation upon receiving Stp_F and Stp_R, respectively, and count until their respective timer counters reach a predetermined value. Then, timer 203F and timer 203R generate set pulse Stp_set and reset pulse Stp_reset, respectively, after time Tdelay has passed. Next, Stp_set is input to a set input of RS flip-flop 204, and Stp_reset is input to a reset input of RS flip-flop 204. Then, the RS flip-flop outputs inverted output signal Qp as stop control signal Stp_ctrl.

Accordingly, as illustrated in FIG. 2, with stop signal controller 20, Stp_ctrl is changed from a high level to a low level after Tdelay has passed from a falling edge of Stp, and Stp_ctrl is then output. In addition, Stp_ctrl is changed from a low level to a high level after Tdelay has passed from a rising edge of Stp, and Stp_ctrl is then output.

Herein, time Tdelay may be set to a transformation delay time of a CT (several microseconds to ten or so microseconds).

In this manner, in a case where the difference between the maximum value and the minimum value of the three phase voltage command values is smaller than or equal to a predetermined threshold, stop signal controller 20 outputs a stop control signal obtained by delaying a stop signal by the amount of time it takes motor current detector 11 and $\Delta\Sigma$ AD conversion block 15 to convert a leakage current to a digital signal.

Next, in clock generating block 13 of AD conversion block 15, the presence of an output of source clock Cka is controlled by stop control signal Stp_ctrl output from stop signal controller 20, and AD conversion clock Ckc that includes a clock stop period is output.

In one specific example, as illustrated in FIG. 2, in a case where stop control signal Stp_ctrl is at a low level, AD conversion clock Ckc and thinning clock Ckn stop, and AD converter 12 and thinning filter 14 also stop operating.

In this manner, with a configuration in which the operation is stopped from the switching of the power conversion element until a leakage current reaches an input to be detected by AD conversion block 15, any decrease in the detection accuracy of current detection signal Si associated with a leakage current that occurs in the above period can be reduced. Then, current detection signal Si with little or no unwanted component mixed therein can be obtained. Thus, any unnecessary torque produced in the motor is reduced, and microvibration can be suppressed.

The influence of a leakage current is relatively large at the time of a servo lock in which motor 30 stops or at the time of low driving as in low-speed rotation. Therefore, the stop-enabled mode can be determined with the use of motor current detection value Di and the motor speed as well as voltage command value Sw of each phase.

For example, in a case where motor current detection value Di is used, the following operation may be performed. Specifically, stop signal generator 19 monitors motor current detection value Di received from digital controller 17 illustrated in FIG. 1. Then, stop signal generator 19 refrains from outputting stop signal Stp in a case where motor current detection value Di is greater than or equal to a predetermined current value (current threshold). Meanwhile, stop signal generator 19 outputs stop signal Stp based on the output determination described above in a case where motor current detection value Di is smaller than the current threshold. The current threshold may be set to a current value that reduces an influence of false detection of a leakage current with respect to the motor current. The current threshold is set to a value that is approximately 10% of the rated motor current.

In a case where the motor speed is used, the following operation may be performed. Specifically, stop signal generator 19 monitors the motor speed received from digital controller 17. Then, stop signal generator 19 refrains from outputting stop signal Stp in a case where the motor speed is greater than or equal to a predetermined speed (speed threshold). Meanwhile, stop signal generator 19 outputs stop signal Stp based on the output determination described above in a case where the motor speed is lower than the speed threshold. The speed threshold may be set to a speed that reduces an influence of a leakage current with respect to the motor current. The speed threshold is set to several hundred rotations per minute.

With the configuration described above, measures can be taken against the decrease in the detection accuracy associated with a leakage current while targeting only the time of a servo lock or a low-speed operation in which the influence of a leakage current increases.

As described thus far, motor control device 10 can reduce false detection of a leakage current caused by switching of a power conversion element even in a case where a delay has occurred when a current from motor current detector 11 is converted to an analog voltage. Accordingly, unnecessary torque produced in motor 30 can be reduced, and microvibration can be suppressed.

INDUSTRIAL APPLICABILITY

The present disclosure can be widely used in a motor control device that controls a motor through pulse width modulation (PWM) control of a voltage to be applied to a winding in the motor.

REFERENCE MARKS IN THE DRAWINGS 10 motor control device
11 motor current detector
12 ΔΣ-type AD converter
13 clock generating block
14 AD conversion thinning filter
15, 15U, 15W ΔΣ AD conversion block
16 PW modulator
17 digital controller
18 power converter
19 stop signal generator
20 stop signal controller
30 motor
31 position detection sensor
35 higher device
100 motor control system

The invention claimed is:

1. A motor control device that includes a motor current detector and controls an operation of a motor, the motor including a stator having windings of three phases wound thereon, the motor current detector detecting a current that flows in the windings, the motor control device comprising:
  a digital controller that performs a torque computation based on an operation command from a higher device, position information of the motor, and a motor current detection value indicating a value of a current that flows in the windings, and calculates three phase voltage command values for driving the motor;
  a pulse width (PW) modulator that performs pulse width modulation (PWM) by comparing the three phase voltage command values against a triangular wave and outputs three phase PWM switching signals;
  a power converter that applies a given voltage within a predetermined range to the windings by switching a power conversion element on or off in accordance with the three phase PWM switching signals;
  the motor current detector that converts a current that flows in the windings in response to the given voltage to an analog voltage;
  a ΔΣ analog-to-digital (AD) conversion block that converts the analog voltage to a digital signal;
  a stop signal generator that outputs a stop signal for stopping of an operation of the ΔΣ AD conversion block; and
  a stop signal controller that, based on the stop signal, outputs a stop control signal that causes the ΔΣ AD conversion block to stop operating, wherein
  when a difference between a maximum value and a minimum value of the three phase voltage command values is smaller than or equal to a predetermined threshold,
    the stop signal generator outputs the stop signal while a leakage current caused by on and off of the power conversion element is occurring, and
    the stop signal controller outputs the stop control signal obtained by delaying the stop signal by an amount of time it takes the motor current detector and the ΔΣ AD conversion block to convert the leakage current to the digital signal.

2. The motor control device according to claim 1, wherein the position information is information on a position of a rotor in the motor detected by a position detection sensor.

3. The motor control device according to claim 1, wherein the stop signal generator
  includes a timer,
  starts outputting the stop signal and starts a timing operation when any one of the three phase PWM switching signals has changed first within a region between an upper vertex and a lower vertex of the triangular wave, and
  outputs the stop signal until a timer counter reaches a predetermined value.

4. The motor control device according to claim 1, wherein the ΔΣ AD conversion block includes:
  a ΔΣ-type AD converter that converts the analog voltage to a 1-bit digital signal;
  an AD conversion thinning filter that converts the 1-bit digital signal to a multi-bit digital signal and outputs the multi-bit digital signal as the motor current detection value; and
  a clock generating block that outputs an operation clock that causes the ΔΣ-type AD converter and the AD conversion thinning filter to operate, and
the operation clock is stopped by the stop control signal.

5. The motor control device according to claim 1, wherein the stop signal generator refrains from outputting the stop signal when the motor current detection value is greater than or equal to a predetermined value.

6. The motor control device according to claim 1, wherein the stop signal generator refrains from outputting the stop signal when a motor speed is greater than or equal to a predetermined value.

* * * * *